United States Patent [19]
Wong et al.

[11] Patent Number: 5,685,588
[45] Date of Patent: Nov. 11, 1997

[54] WAFER HANDLER HAVING A FLEXIBLE PAD

[75] Inventors: Jin Tu Wong; Tzoung-Gann Cheng, both of Hsin-Chu, Taiwan

[73] Assignee: Taiwan Semiconductor Manufacturing Company Ltd., Hsin-Chu, Taiwan

[21] Appl. No.: 592,928

[22] Filed: Jan. 29, 1996

[51] Int. Cl.$^6$ .................................................. B25J 15/06
[52] U.S. Cl. .......................... 294/64.1; 294/902; 414/939
[58] Field of Search ...................... 294/1.1, 32, 64.1–65, 294/902; 901/40; 414/935, 936, 937, 939, 941; 29/743

[56] References Cited

U.S. PATENT DOCUMENTS

| | | | |
|---|---|---|---|
| 3,084,928 | 4/1963 | Opitz | 294/64.1 |
| 3,377,096 | 4/1968 | Wood | 294/64.1 |
| 4,266,905 | 5/1981 | Birk et al. | 294/64.1 |
| 4,529,353 | 7/1985 | Dean et al. | 414/941 |
| 4,960,298 | 10/1990 | Moroi | 294/64.1 |
| 5,374,091 | 12/1994 | Gore et al. | 294/64.1 |

*Primary Examiner*—Dean Kramer
*Attorney, Agent, or Firm*—George O. Saile; Stephen B. Ackerman; William J. Stoffel

[57] ABSTRACT

An improved wafer handler having a wafer chuck that properly picks up wafers from a wafer track of an ion implant machine is provided. The wafer handler comprises: an input arm having a wafer chuck and a wafer pad adjustably mounted to the wafer chuck. The wafer pad preferably has an oval shape. The wafer handler can pick up a horizontal wafer and set the wafer down on an angled surface. The oval shape, dimensions, flexible material and mounting screws of the wafer pad enable the pad to form a vacuum with the wafer and to properly handle the wafer. The wafer handler and wafer pad greatly reduce wafer breakage and damage to the implant machine from the broken wafers.

21 Claims, 4 Drawing Sheets

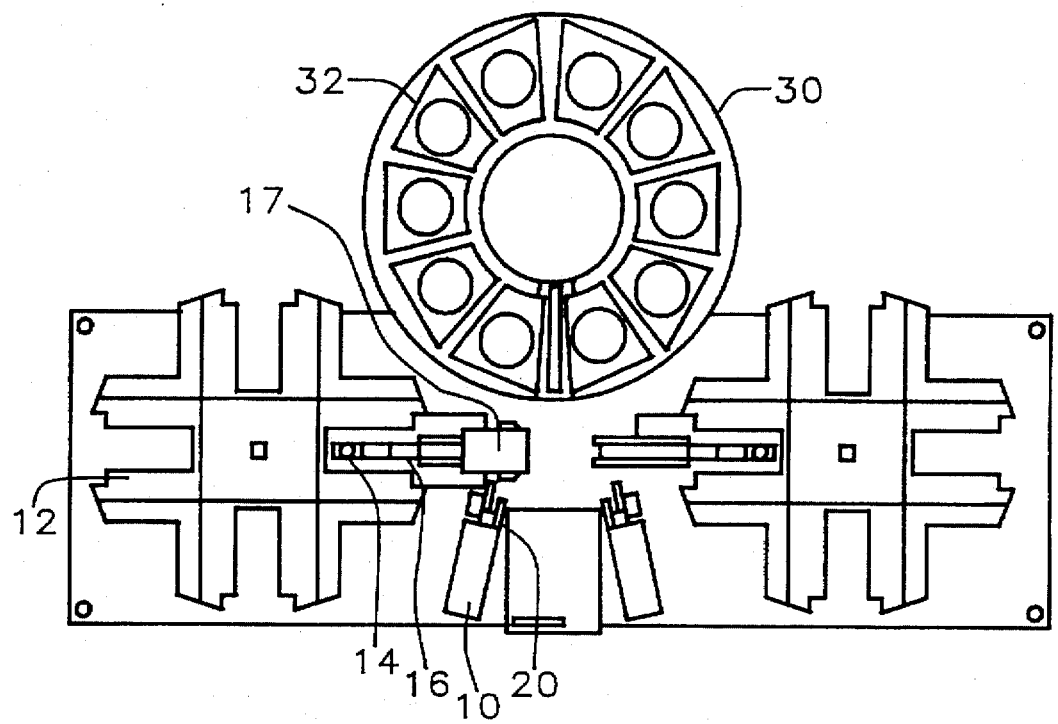
*FIG. 1 - Prior Art*
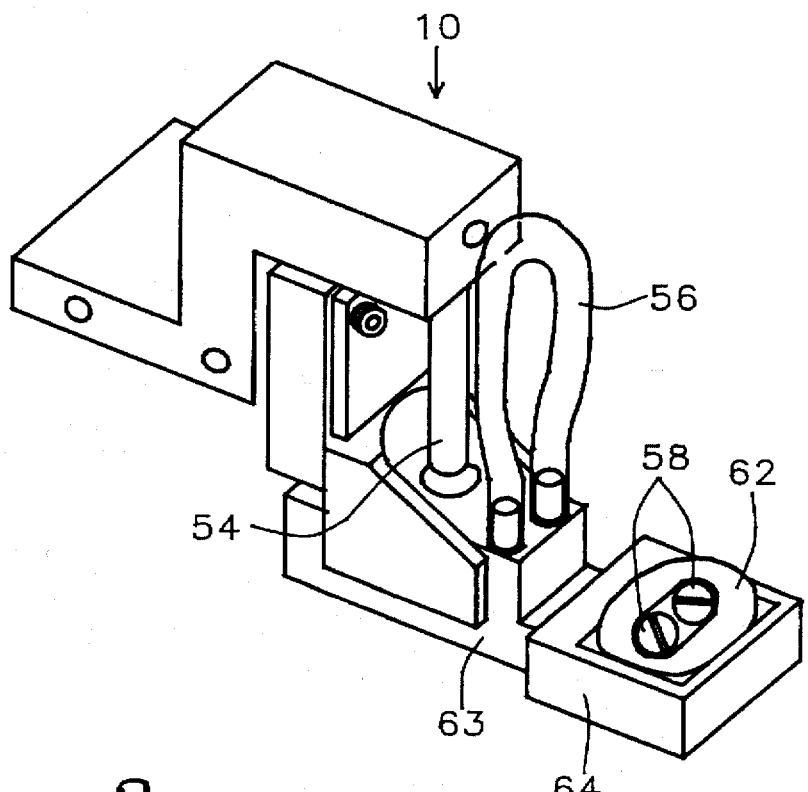
*FIG. 2*

WAFER HANDLER HAVING A FLEXIBLE PAD

BACKGROUND OF INVENTION

1. Field of the Invention

This invention relates to a device for an ion implant machine used in semiconductor manufacturing, and particularly to the wafer handling tool for an ion implant machine and more particularly an improved adjustably mounted flexible wafer pad for a wafer chuck.

2. Description of the Prior Art

Ion implantation is an important process in semiconductor manufacturing and must perform accurately and reliably. An ion implanter implants impurity ions into a semiconductor substrate to form doped regions, such as sources and drains. The fundamental purpose of an ion implant system is to deliver a beam of ions of a particular type and energy to the surface of a silicon substrate. Ion Implanters are automated tools which are expensive and must be kept running reliably. This includes the wafer handling systems which load and unload wafers onto the implanter disk. Wafers must be handled properly onto the implanter disk for the implanter to properly implant the wafer and to avoid wafer breakage.

FIG. 1 shows a top down schematic view of an ion implanter having a wafer loader system with automatic transfer. Wafers are placed in an input wafer cassette 12 and are moved with input belts 14 to an input air track 16. The input air track 16 moves the wafer to a wafer staging area 17 where it awaits handling by an input wafer chuck 20. The wafer chuck must maneuver under the horizontal wafer, pick up the wafer and load the wafer onto a wafer clamp 32 in the indexer disk 30.

The input chuck 20 moves the wafer from wafer staging area 17 onto a wafer clamp 32 on the indexer disk 30. The wafer is initially horizontal in the wafer staging area 17. At the end of the wafer handling, the wafer is held at about 7° angle by the wafer clamp 32. These different angles for the picking up and putting down the wafers creates problems for the wafer handlers where wafers are broken and fragments from broken wafers damage the implanter and wafer handling equipment.

A problem with the current wafer transporter 10 is that the input chuck 20 does not consistently pick up the wafers from the wafer staging area and place the wafer in the wafer clamp on the index disk. Because of this wafer handling problem, wafers are broken and not loaded properly. Moreover, when the wafers break, they can damage other nearby equipment, such as the vacuum bellows. Wafer handling problems cause expensive ion implant machine down time and incur high maintenance costs.

Another problem with the current wafer handlers is that they have very tight wafer chuck adjustment tolerances where the wafer chuck frequently comes out of adjustment. Also, the adjustment process is complicated and time consuming as often four or more adjustment points must be fine tuned. When the wafer chuck comes out of adjustment, the wafer handling problems described above occur.

Therefore there is a need to develop an improved wafer transporter 10 with an improved wafer chuck that can lift the wafers and properly load them onto a wafer clamp. Moreover, there is need to develop a wafer transporter that can pick up horizontal wafers and properly load the wafers onto a wafer clamp at about a 7° angle from horizontal.

SUMMARY OF THE INVENTION

It is an object of the present invention to provide an improved wafer chuck that is adapted to lift horizontal positioned wafers and place the wafers on an angled surface.

It is another object of the present invention to provide an improved wafer handler for an ion implant tool having a wafer chuck that is adapted to transport horizontal wafers to an angled wafer clamp on an indexer disk.

It is another object of the present invention to provide an improved wafer handler for an ion implant tool having a wafer chuck/wafer pad combination that is easy to adjust and has large adjustment limits.

According to the present invention, an improved wafer handler having a wafer chuck is provided. The improvement being a flexible wafer pad with an oval shape adjustably mounted on the wafer chuck. An improved wafer handler has a wafer chuck and wafer pad combination that properly picks up wafers from a wafer track of an ion implant machine and reduces the amount of calibrations/adjustments required. The wafer handler comprises: input arm, attached to a wafer chuck. A wafer pad, preferably having an oval shape is adjustably mounted the wafer chuck 64. The wafer pad is preferably adjustably mounted by two adjustment screws to the wafer chuck. The wafer handler can move the wafer pad under the wafer and pivot the pad up under the wafer to pick up the wafer. When the wafer pad contacts the wafer, a vacuum holds the wafer to the wafer pad. The oval shape and size of the wafer pad are important and allow the pad to properly pick up the wafer. The wafer handler moves the wafer to the index disk and set the wafer down on an angled surface near the wafer clamp.

The improved wafer handler (i.e. wafer transporter) and wafer pad of the current invention reduce wafer handling problems and wafers breakage. The wafer pad and the adjustment mounting screws increase the adjustment tolerances and make adjustments simpler. Moreover, damage to near by equipment such as the vacuum bellows is reduced by reducing wafer breakage. The wafer handler of the present invention reduces expensive ion implant machine down time and reduces maintenance costs.

BRIEF DESCRIPTION OF THE DRAWINGS

The features and advantages of a wafer handler according to the present invention and further details such a wafer handler in accordance with the present invention will be more clearly understood from the following description taken in conjunction with the accompanying drawings in which like reference numerals designate similar or corresponding elements, regions and portions and in which:

FIG. 1 shows schematic view of a conventional ion implanter having a wafer handler.

FIG. 2 is simplified view of the wafer handler having a wafer chuck and wafer pad of the present invention.

DETAILED DESCRIPTION OF THE PREFERRED EMBODIMENTS

The present invention will be described in detail with reference to the accompanying drawings. According to the present invention, an improved wafer handler 10 for an ion implant machine is provided. The improvement being a flexible wafer pad 62 adjustably mounted on a wafer chuck 64 that enables the wafer chuck 64 to pick up wafers from a horizontal surface and place the wafer down on an angled surface.

As shown in FIG. 2, the improved wafer handler 10 (e.g., wafer transporter) has input arm 63 attached to a wafer chuck 64 that properly picks up wafers from a wafer track of an ion implant machine.

The wafer chuck 64 has a wafer pad 62 which preferably has a round, square, or oval shape and more preferably has an oval shape. The shape and dimensions of the wafer pad is critical to the ability of the wafer chuck to pick up the wafers and to increase the adjustment tolerances. The wafer handler 10 can move the wafer pad, under a wafer and pivot the wafer pad 62 up under the wafer to pick up the wafer has shown in FIGS. 4A–4E.

Figure 3A:
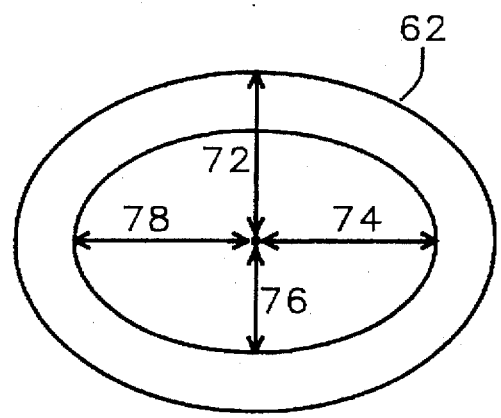
FIG. 3A is a top view of the wafer pad of the present invention.
Figure 3B:
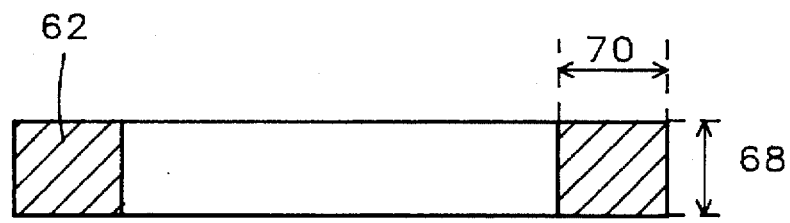
FIG. 3B is a side view of the wafer pad of the present invention.

Referring to FIGS. 3A and 3B, the wafer pad has a thickness 68 in the range of between about 1.8 and 2.2 mm and more preferably about 2.0 mm. The wafer pad 62 has a width 70 in the range of between about 3.8 and 4.2 mm and more preferably about 4.0 mm. As shown in FIG. 3A the wafer pad 62 has a long outer radius 74 in the range of between about 8.8 and 9.2 mm and more preferably about 9.0 mm; and has a long inner radius 78 in the range of between about 4.8 and 5.2 mm and more preferably about 5.0 mm. As shown in FIG. 3A the wafer pad 62 has a short outside radius 72 in the range of between about 6.8 and 7.2 and more preferably about 7.0 mm; and has a short inside radius 76 in the range of between about 3.8 and 3.2 and more preferably about 3.0 mm. The wafer pad can be formed on any suitable non-contaminating flexible material and is preferably formed of a plastic or rubber material.

Any size wafers can be used with the wafer pad, as the wafer pad 62 can be scaled proportionally. Preferably, for the dimensions given herein, the wafer preferably has a diameter in the range of between about 4 and 8 inches and more preferably about 6 inches.

Figure 3C:
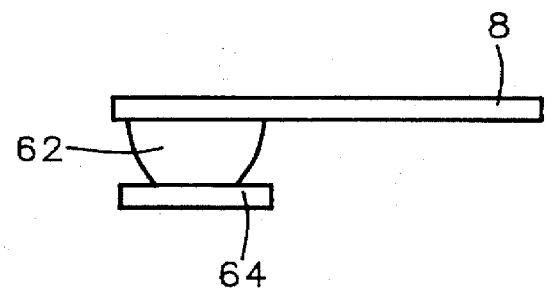
FIG. 3C is a side view of the wafer pad of the present invention where the adjustments screws are tightened.
Figure 3D:
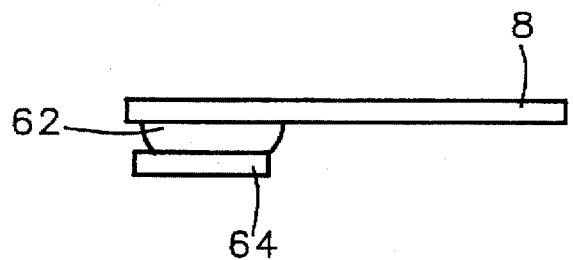
FIG. 3D is a side view of the wafer pad of the present invention where the adjustments screws are loosened.

As shown in FIGS. 2, the wafer pad 62 can be adjusted laterally, horizontally, and vertically by adjustment screws 58. The wafer pad can be adjusted laterally and horizontally by loosing the adjustment screws 58 and moving the pad to the proper position to ensure proper contact with the wafer. As shown in FIG. 3C, tightening the adjustment screws causes the heads of the adjustment screws to press down on the inside edge of the wafer pad thereby forcing the pad material out and causing the outside edges to rise. The adjustment screws 58 pinch down on the inside potion of the wafer pad 62 causing the wafer pad material to move outward and upward thus causing the height of the wafer pad to increase on the outside. Likewise, as shown in FIG. 3D, loosening the adjustment screws 58 lowers the pad.

The vacuum bellows 54 is shown in FIG. 2. The purpose of the vacuum bellows is allow a vacuum to pass through the moving parts of the wafer handler 10. The vacuum passes through conduits in the handler (not shown), in the vacuum bellows, in the arm 63, and in the wafer chuck 64 near the wafer pad 62. The vacuum holds the wafer onto the wafer pad 62. A bellows protection tube 56 partially protects the vacuum bellows 54 from damage by mishandled wafers.

Figure 4A:
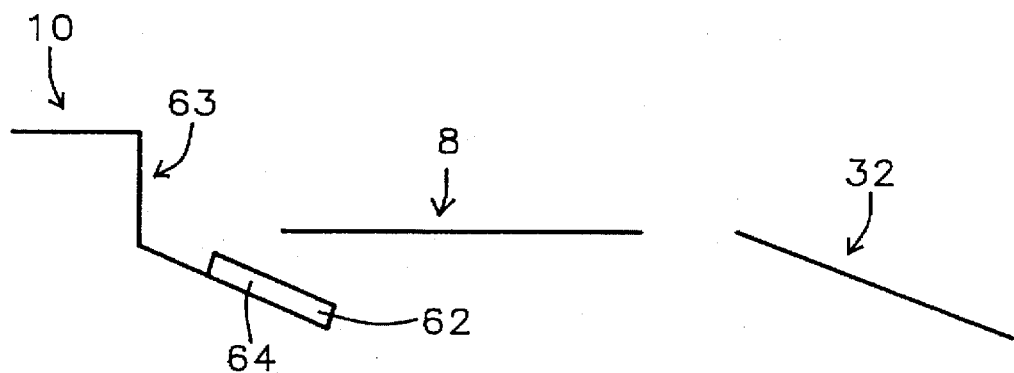
FIG. 4A–E is are side schematic views of the action of the wafer handler and wafer pad of the present invention.
Figure 4B:
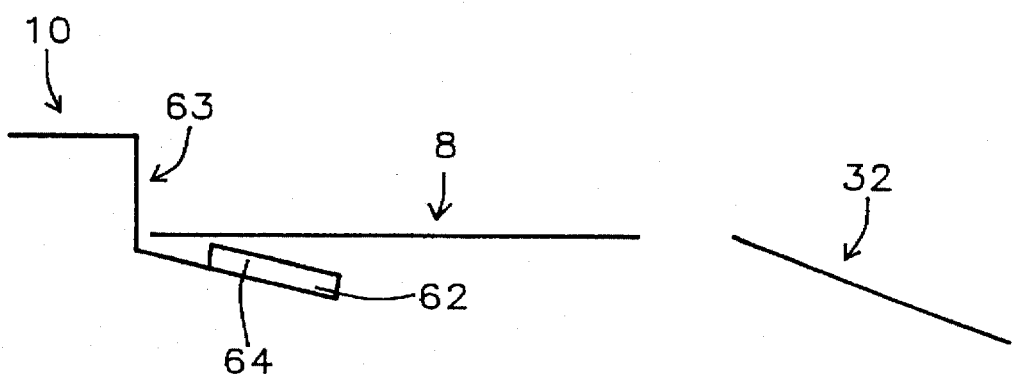
Figure 4C:
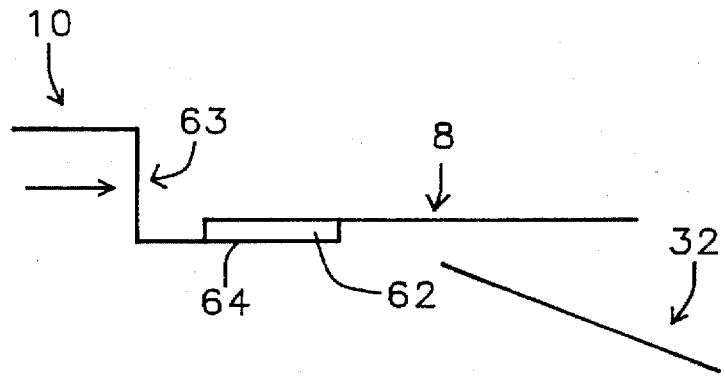
Figure 4D:
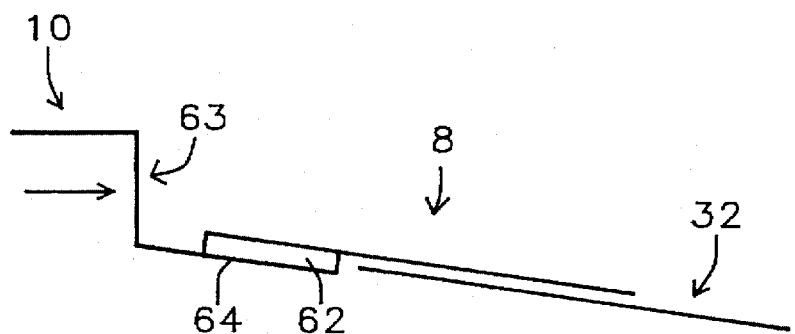
Figure 4E:
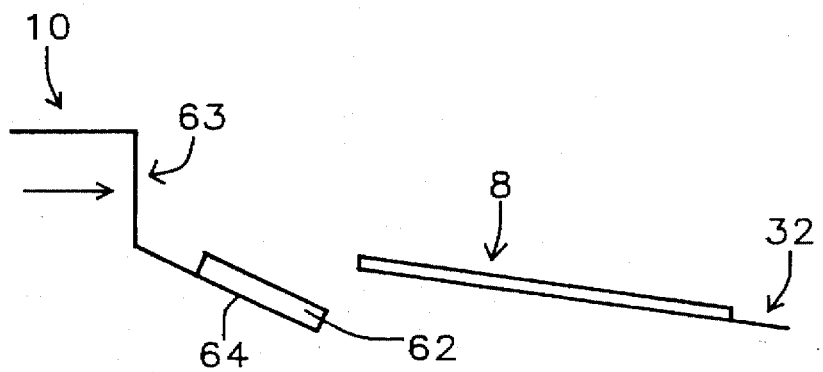

The chuck 64 and wafer pad 62 approach the wafer 8 as shown in schematic FIGS. 4A–E. The chuck 64 approaches the wafer 8 at an angle in the range of between about 5 and 9 and more preferably about 7 degrees. FIG. 4B shows the wafer chuck/wafer pad 64 62 pivoting upwards to contact the wafer 8. Then the pad 62 contacts the wafer, the vacuum makes a seal with between the wafer pad 62 and the wafer 8. The oval shape, dimensions and flexible material of the wafer pad 62 allow the wafer pad to form a good vacuum seal with the wafer 8 and to properly handle the wafer. The flexible material and oval shape/dimensions of the wafer pad increase the adjustment tolerances required to properly handle the wafer. FIG. 4C shows the wafer handler 10 moving the wafer 8 towards the inclined wafer clamp 32 on the ion implanter disk 30. When the wafer 8 is over the clamp, the wafer chuck 64 pivots downward. FIG. 4D shows the wafer 8 properly set at an angle on the wafer clamp/indexer. FIG. 4E shows the wafer handler and wafer pad being withdrawn after successfully positioning the wafer on the wafer clamp 32.

According to the present invention, an improved wafer handler for an ion implant machine is provided. The improvement being an flexible oval wafer pad 62 adjustably mounted a wafer chuck 64 that enables the wafer chuck 64 to pick up wafers. The improved wafer handler (i.e. wafer transporter) and wafer pad 62 of the current invention reduce wafer handling problems and wafers breakage. Moreover, damage to near by equipment such as the vacuum bellows 54 is reduced by reducing wafer breakage. The wafer handler 10 of the present invention reduces expensive ion implant machine down time and reduces maintenance costs. The flexible pad and adjusting screws increase the adjustment tolerance and reduce down time for adjustments.

While the invention has been particularly shown and described with reference to the preferred embodiments thereof; it will be understood by those skilled in the art that various changes in form and details may be made without departing from the spirit and scope of the invention.

What is claimed is:

1. A wafer handler, said wafer handler having an input arm, a wafer chuck and a wafer pad, comprising:
    a wafer handler having an input arm;
    said input arm attached to a wafer chuck;
    a wafer pad adjustably mounted to said wafer chuck; and
    said wafer pad formed of a flexible material and having an oval shape, said wafer pad having a height; and
    a screw adjusting means for adjusting said height of said wafer pad.

2. The wafer handler of claim 1 wherein said wafer pad has a thickness in the range of between about 1.8 and 2.2 mm and a width in the range of between about 3.8 and 4.2 mm.

3. The wafer handler of claim 1 wherein said wafer pad is formed of a plastic material.

4. The wafer handler of claim 1 wherein said wafer has a diameter in the range of between about 4 and 8 inches.

5. The wafer handler of claim 1 wherein said wafer pad has an oval shape and has a long outer radius in the range of between about 8.8 and 9.2 mm; and has a short outer radius in the range of between about 6.8 and 7.2 mm.

6. The wafer handler of claim 1 wherein said wafer pad is adjustably mounted to said wafer chuck by two adjustment screws, said adjustment screws having heads; said heads contacting said wafer pad.

7. A wafer chuck for a wafer handler comprising:
    a wafer pad adjustably mounted to said wafer chuck by two adjustment screws; said wafer pad having an inside portion; said two adjustment screws adjust the height of said wafer pad by pressing down on said inside portion of said wafer pad; said wafer pad having an oval shape; said wafer pad formed of a plastic material;
    whereby said wafer handler can move said wafer pad under a horizontal wafer and pivot said wafer pad up under said wafer to pick up said wafer and deliver said wafer to an angled surface.

8. The wafer chuck of claim 7 wherein said wafer pad has an oval shape with a thickness in the range of between about 1.8 and 2.2 mm and a width in the range of between about 3.8 and 4.0 mm and a long outer radius in the range of between about 8.8 and 9.2 mm; and has a short outer radius in the range of between about 6.8 and 7.2 mm.

9. The wafer chuck of claim 7 wherein said wafer pad has an oval shape with a thickness in the range of between about 1.8 and 2.2 mm and a width in the range of between about 3.8 and 4.0 mm.

10. The wafer chuck of claim 7 wherein said wafer has a diameter in the range of between about 4 and 8 inches.

11. The wafer chuck of claim 7 wherein said wafer pad is adjustably mounted to said wafer chuck by two adjustment screws, said adjustment screws having heads; and said heads contacting said wafer pad.

12. A wafer pad for a wafer chuck on a wafer handler for an ion implant machine comprising:

a wafer pad adjustably mounted to said wafer chuck by two adjustment screws;

said adjustment screws having heads; said heads contacting said wafer pad;

said wafer pad having an oval shape; said wafer pad formed from a plastic material; said wafer pad having a thickness in the range of between about 1.8 and 2.2 mm and a width in the range of between about 3.8 and 4.2 mm and a long outer radius in the range of between about 8.8 and 9.2 mm; and a short outer radius in the range of between about 6.8 and 7.2 mm; whereby said wafer handler can move said wafer pad under a horizontal wafer and pivot said wafer pad up under said wafer to pick up said wafer and deliver said wafer to an angled surface; said wafer having a diameter in the range between about 4 to 8 inches.

13. A wafer handler for an ion implant machine, said wafer handler having an input arm, a wafer chuck and a wafer pad, comprising:

a wafer handler having an input arm;

said input arm attached to a wafer chuck;

a wafer pad adjustably mounted to said wafer chuck; and said wafer pad formed of a flexible material and having an oval shape, said wafer pad is adjustably mounted to said wafer chuck by two adjustment screws, said adjustment screws having heads; said heads contacting said wafer pad.

14. The wafer handler of claim 13 wherein said wafer pad has a thickness in the range of between about 1.8 and 2.2 mm and a width in the range of between about 3.8 and 4.2 mm.

15. The wafer handler of claim 13 wherein said wafer pad is formed of a plastic material.

16. The wafer handler of claim 13 wherein said wafer has a diameter in the range of between about 4 and 8 inches.

17. The wafer handler of claim 13 wherein said wafer pad has an oval shape and has a long outer radius in the range of between about 8.8 and 9.2 mm; and has a short outer radius in the range of between about 6.8 and 7.2 mm.

18. A wafer chuck for a wafer handler comprising:

a wafer pad adjustably mounted to said wafer chuck by two adjustment screws; said wafer pad having an oval shape; said wafer pad formed of a plastic material, said adjustment screws having heads; and said heads contacting said wafer pad;

whereby said wafer handler can move said wafer pad under a horizontal wafer and pivot said wafer pad up under said wafer to pick up said wafer and deliver said wafer to an angled surface.

19. The wafer chuck of claim 18 wherein said wafer pad has a thickness in the range of between about 1.8 and 2.2 mm and a width in the range of between about 3.8 and 4.0 mm and a long outer radius in the range of between about 8.8 and 9.2 mm; and has a short outer radius in the range of between about 6.8 and 7.2 mm.

20. The wafer chuck of claim 18 wherein said wafer pad has an oval shape with a thickness in the range of between about 1.8 and 2.2 mm and a width in the range of between about 3.8 and 4.0 mm.

21. The wafer chuck of claim 18 wherein said wafer has a diameter in the range of between about 4 and 8 inches.

* * * * *